United States Patent
Zhang et al.

(10) Patent No.: US 11,922,131 B2
(45) Date of Patent: *Mar. 5, 2024

(54) SCALABLE, MULTI-PRECISION, SELF-CALIBRATED MULTIPLIER-ACCUMULATOR ARCHITECTURE

(71) Applicant: Applied Materials, Inc., Santa Clara, CA (US)

(72) Inventors: Xiaofeng Zhang, San Jose, CA (US); She-Hwa Yen, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 504 days.

This patent is subject to a terminal disclaimer.

(21) Appl. No.: 17/092,234

(22) Filed: Nov. 7, 2020

(65) Prior Publication Data

US 2022/0113941 A1    Apr. 14, 2022

Related U.S. Application Data

(60) Provisional application No. 63/089,488, filed on Oct. 8, 2020.

(51) Int. Cl.
*G06F 7/544* (2006.01)
*G06F 17/16* (2006.01)
(Continued)

(52) U.S. Cl.
CPC ............ *G06F 7/5443* (2013.01); *G06F 17/16* (2013.01); *H03M 1/1205* (2013.01); *H03M 1/74* (2013.01)

(58) Field of Classification Search
CPC ................................ G06F 7/5443; G06F 17/16
See application file for complete search history.

(56) References Cited

U.S. PATENT DOCUMENTS

| 5,835,045 A | 11/1998 | Ogawa et al. |
| 6,611,164 B2 | 8/2003 | Uno |

(Continued)

FOREIGN PATENT DOCUMENTS

| KR | 20200058381 A | 5/2020 |
| TW | 202029607 A | 8/2020 |

OTHER PUBLICATIONS

Genov et al., "Massively Parallel Inner-Product Array Processor", IEEE, IJCNN'01. International Joint Conference on Neural Networks. Proceedings (Cat. No. 01CH37222), vol. 1, 2001, pp. 183-188.

(Continued)

*Primary Examiner* — Michael D. Yaary
(74) *Attorney, Agent, or Firm* — Kilpatrick Townsend & Stockton LLP (57) ABSTRACT

A method for performing vector-matrix multiplication may include converting a digital input vector comprising a plurality of binary-encoded values into a plurality of analog signals using a plurality of one-bit digital to analog converters (DACs); sequentially performing, using an analog vector matrix multiplier and based on bit-order, vector-matrix multiplication operations using a weighting matrix for the plurality of analog signals to generate analog outputs of the analog vector matrix multiplier; sequentially performing an analog-to-digital (ADC) operation on the analog outputs of the analog vector matrix multiplier to generate binary partial output vectors; and combining the binary partial output vectors to generate a result of the vector-matrix multiplication.

20 Claims, 7 Drawing Sheets

(51) Int. Cl.
    *H03M 1/12*     (2006.01)
    *H03M 1/74*     (2006.01)

(56)     References Cited

U.S. PATENT DOCUMENTS

| | | |
|---|---|---|
| 8,228,076 B2 | 7/2012 | Cormier et al. |
| 11,355,167 B2 | 6/2022 | Seok et al. |
| 2004/0243657 A1* | 12/2004 | Goren .................... G06E 1/045 |
| | | 708/607 |
| 2017/0228345 A1* | 8/2017 | Gupta .................... G06G 7/19 |
| 2018/0157622 A1 | 6/2018 | Dourbal |
| 2019/0080230 A1 | 3/2019 | Hatcher et al. |
| 2020/0081937 A1 | 3/2020 | Fick et al. |
| 2020/0242190 A1 | 7/2020 | McCollum et al. |
| 2020/0401206 A1 | 12/2020 | Kallam et al. |
| 2022/0108158 A1 | 4/2022 | Grobis et al. |
| 2022/0113942 A1 | 4/2022 | Yen et al. |

OTHER PUBLICATIONS

Edward H. Lee et al., "Analysis and Design of a Passive Switched-Capacitor Matrix Multiplier for Approximate Computing", IEEE Journal of Solid-State Circuits 52(1), pp. 261-271, Sep. 29, 2016 [retrieved on: Dec. 28, 2021], Retrieved from: <https://ieeexplore.ieee.org/document/7579580> pp. 261-266; and figure 1.
Application No. PCT/US2021/052508, International Search Report and Written Opinion, dated Jan. 17, 2022, 3 pages.

* cited by examiner

SCALABLE, MULTI-PRECISION, SELF-CALIBRATED MULTIPLIER-ACCUMULATOR ARCHITECTURE

CROSS-REFERENCES TO RELATED APPLICATIONS

This application claims the benefit of U.S. Provisional Application No. 63/089,488, filed Oct. 8, 2020, the entire contents of which, including an appendix, are incorporated herein by reference in their entirety for all purposes.

TECHNICAL FIELD

This disclosure generally relates to multiplier-accumulator (MAC) operations and implementations. Specifically, this disclosure relates to a scalable, multi-precision, self-calibrated MAC that generates binary partial output vectors.

BACKGROUND

A vector-matrix multiplication operation can be defined as the sum of a product of a vector and a matrix. Specifically, Equation 1 can be used to define a vector-matrix multiplication operation in which the product is summed.

$$Y = \sum_i W_{ij} X_i \qquad \text{Eq. 1}$$

In Equation 1, X is an input vector composed of values (which can be represented in an electronic environment using binary bits) and $W_{ij}$ represents matrix weighting values. Y is the output vector obtained by summing the product vector. This function has applications in various signal processing, image processing, and artificial intelligence applications, such as in the use of neural-networks.

Performing this equation, when performed digitally, can consume a significant amount of processing resources and/or energy. Conventional analog componentry or digital and analog hybrid componentry can require a relatively large number of clock cycles, and/or a relatively large area of space to implement.

SUMMARY

In some embodiments, a method for performing vector-matrix multiplication may include converting a digital input vector comprising a plurality of binary-encoded values into a plurality of analog signals using a plurality of one-bit digital to analog converters (DACs). The method may also include sequentially performing, using an analog vector matrix multiplier and based on bit-order, vector-matrix multiplication operations using a weighting matrix for the plurality of analog signals to generate analog outputs of the analog vector matrix multiplier. The method may additionally include sequentially performing an analog-to-digital (ADC) operation on the analog outputs of the analog vector matrix multiplier to generate binary partial output vectors. The method may further include combining the binary partial output vectors to generate a result of the vector-matrix multiplication.

In any embodiment, any or all of the following features may be included in any combination and without limitation. A number of clock cycles to sequentially perform the vector-matrix multiplication operations using the weighting matrix may be equal to a number of bit-orders of the binary-encoded values of the input vector. Sequentially performing the ADC operation may include storing a first voltage representing a first analog output in the analog outputs on a first capacitor during a current clock cycle; and reading a second voltage representing a second analog output in the analog outputs on a second capacitor during the current clock cycle, where the second voltage may have been stored on the second capacitor during a previous clock cycle. Generating the binary partial output vectors may include comparing a voltage representing an analog output in the analog outputs to a voltage reference, generating digital feedback based on a result of comparing the voltage to the voltage reference, and/or converting the digital feedback into analog feedback and injecting the analog feedback into the voltage and the voltage reference to repeatedly generate bits for a binary partial output vector in the binary partial output vectors. The voltage reference may be adjusted based on a difference between results of the vector-matrix multiplication and an expected result.

In some embodiments, a vector-matrix multiplier circuit may include a plurality of digital inputs, where each digital input may receive a binary-encoded input value of an input vector. The circuit may also include a plurality of one-bit digital to analog converters (DACs). Each one-bit DAC may be connected with a corresponding digital input of the plurality of digital inputs; and each one-bit DAC may output a binary-encoded analog signal for the corresponding digital input. The circuit may additionally include an analog vector matrix multiplier circuit that performs binary-encoded vector multiplication operations on a single bit-order at a time. The analog vector matrix multiplier circuit may receive the binary-encoded analog signal from each one-bit DAC of the plurality of one-bit DACs and generate analog outputs corresponding to the single bit-orders. The circuit may further include an analog-to-digital converter (ADC) that generates binary partial output vectors from the analog outputs, and a binary-weighted summation circuit that combines the binary partial output vectors to generate a result for the vector-matrix multiplier circuit. The analog vector matrix multiplier circuit may output a plurality of currents indicative of vector multiplication outputs.

In any embodiment, any or all of the following features may be included in any combination and without limitation. The analog vector matrix multiplier circuit may output a plurality of currents indicative of vector multiplication outputs. The analog vector matrix multiplier circuit may include a plurality of weighting components that apply a pre-defined weighting to output from the analog vector matrix multiplier circuit. The ADC may include a capacitor network comprising a first pipeline and a second pipeline of capacitors and switches. The ADC may include a comparator that generates a plurality of comparisons during one of the binary-encoded vector multiplication operations by generating a sequence of comparisons. The circuit may also include a finite state machine that generates feedback that is injected into inputs of the comparator between comparisons in the sequence of comparisons. The binary-weighted summation circuit may include a binary shift and a binary addition operation. The binary-weighted summation circuit may include a circuit that detects when a maximum output value has been reached and terminates the binary-encoded vector multiplication operations.

In some embodiments, an apparatus for performing vector-matrix multiplication may include a plurality of one-bit digital to analog converters (DACs) that convert an input vector comprising a plurality of binary-encoded values into a plurality of analog signals. The apparatus may also include means for sequentially performing, using an analog vector matrix multiplier and based on bit-order, vector-matrix multiplication operations using a weighting matrix for the plurality of analog signals to generate analog outputs of the analog vector matrix multiplier. The apparatus may also include means for sequentially performing an analog-to-digital (ADC) operation on the analog outputs of the analog vector matrix multiplier to generate binary partial output vectors. The apparatus may also include means for combining the binary partial output vectors to generate a result of the vector-matrix multiplication.

In any embodiment, any or all of the following features may be included in any combination and without limitation. A number of clock cycles to sequentially perform the vector-matrix multiplication operations for each-bit-order may be equal to a number of bit-orders of the binary-encoded values of the input vector. A DAC may inject feedback that is input dependent and range dependent into a comparator that generates the binary partial output vectors. A DAC may injects feedback that is input dependent in a time domain into a comparator that generates the binary partial output vectors. A DAC may injects feedback that is threshold dependent in a time domain into a comparator that generates the binary partial output vectors.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Traditional MAC designs require processing to be complete in one stage of a MAC pipeline before that value can be passed on to a subsequent stage. For analog multipliers, this includes converting a digital input into an analog signal, multiplying the analog signal with a weighting matrix, and converting the analog output into a digital representation. This digital representation may then be passed on to a subsequent stage, which also converts that digital representation back into an analog signal for multiplication. The output of the multiplier is summed in the analog domain before conversion back into the binary domain. This creates a technical problem where the precision and throughput of a MAC unit cannot be changed after implementation. This also limits the scalability and types of applications for which a MAC array can be used.

The embodiments described herein use a bit-order MAC unit that generates binary partial output vectors that can then be summed in the binary domain or passed to a subsequent MAC layer for processing in a pipeline. Analog outputs from the multiplier are stored in a pipelined switch-capacitor network such that results can be generated on every clock cycle. A comparator may make successive comparisons to generate a binary vector for each partial analog output. This solves the technical problem described above by allowing the number of bits processed at the input and provided at the output to be dynamically changed at runtime to provide scalability and adjustable throughput and/or precision for any design. The partial binary outputs can then be summed in the binary domain using binary shift and binary add operations that are computationally inexpensive.

Embodiments detailed herein allow for MAC operations to be performed during a shorter amount of time (e.g., fewer clock cycles) compared to conventional analog embodiments and do not require digital input signals to be decoded. Rather, input vectors in the form of binary encoded (or "bit-ordered") values can be received. Such values are typically arranged from LSB to MSB, or MSB to LSB (e.g., "1110", representing a value of 14). These values can be multiplied in the analog domain then summed in the analog or digital domain. Arrangements detailed herein are performed directly on analog conversions of binary encoded values and do not require the input vectors to be converted to a series of pulses (e.g., fourteen pulses to represent a value of 14). Thus, computation can be performed significantly quicker than conventional analog arrangements. More specifically, the number of operation cycles to perform vector-matrix multiplication can be reduced by $$\frac{2^{Nbit}}{Nbit+2}$$

times. In this equation, the additional 2 cycles indicated in the denominator can vary by implementation. For example, embodiments detailed herein can perform vector-matrix multiplication for 8-bit input vectors that may be sped up 25.6 times as compared to conventional analog MAC designs.

Further, the arrangements detailed herein may have significant space savings over conventional analog MAC designs. By using one bit digital-to-analog converters (DACs), less area may be needed than if multi-bit DACs that convert a binary value received in parallel are used. Specifically, multiple one bit DACs may be used to convert binary-encoded input vectors to binary-encoded analog voltage values in parallel. For instance, for four bit input vectors, four clock cycles may be needed to output the binary-encoded analog voltage value from the one-bit DAC (one cycle for LSB, one cycle for second LSB, one cycle for second MSB, one cycle for MSB). The number of one-bit DACs may be dependent on the number of input vectors ($X_i$ in Equation 1).

Matrix multiplication operations may be performed sequentially for each bit-order of the input vector's values at a time. The parallel output of each one-bit DAC may be input to weighting components of a vector matrix multiplier circuit. The vector matrix multiplier circuit may have various weighting components that correspond to the $W_{ij}$ matrix of Equation 1 with which $X_i$ is being multiplied. The vector matrix multiplier circuit may perform multiplication operations for each bit-order of the input vectors. Therefore, if the input vector contains values four bits in length, the vector matrix multiplier circuit may perform multiplication operations for each of the four bit-orders sequentially in the time domain. The output from the vector matrix multiplier circuit may be sequential signals (e.g., that have a current or some of electrical characteristic indicative of a multiplication result) that are output to a summation circuit.

The summation circuit may function to perform a bit-order weighted summation after the matrix multiplication operations have been performed. The summation circuit may function in either the analog or digital domain. The summation circuit may receive signals from the vector matrix multiplication circuit, store indications of each matrix multiplication operation in such a way that it is weighted for the proper bit-order, and perform a summation to determine the output value Y.

Figure 1:
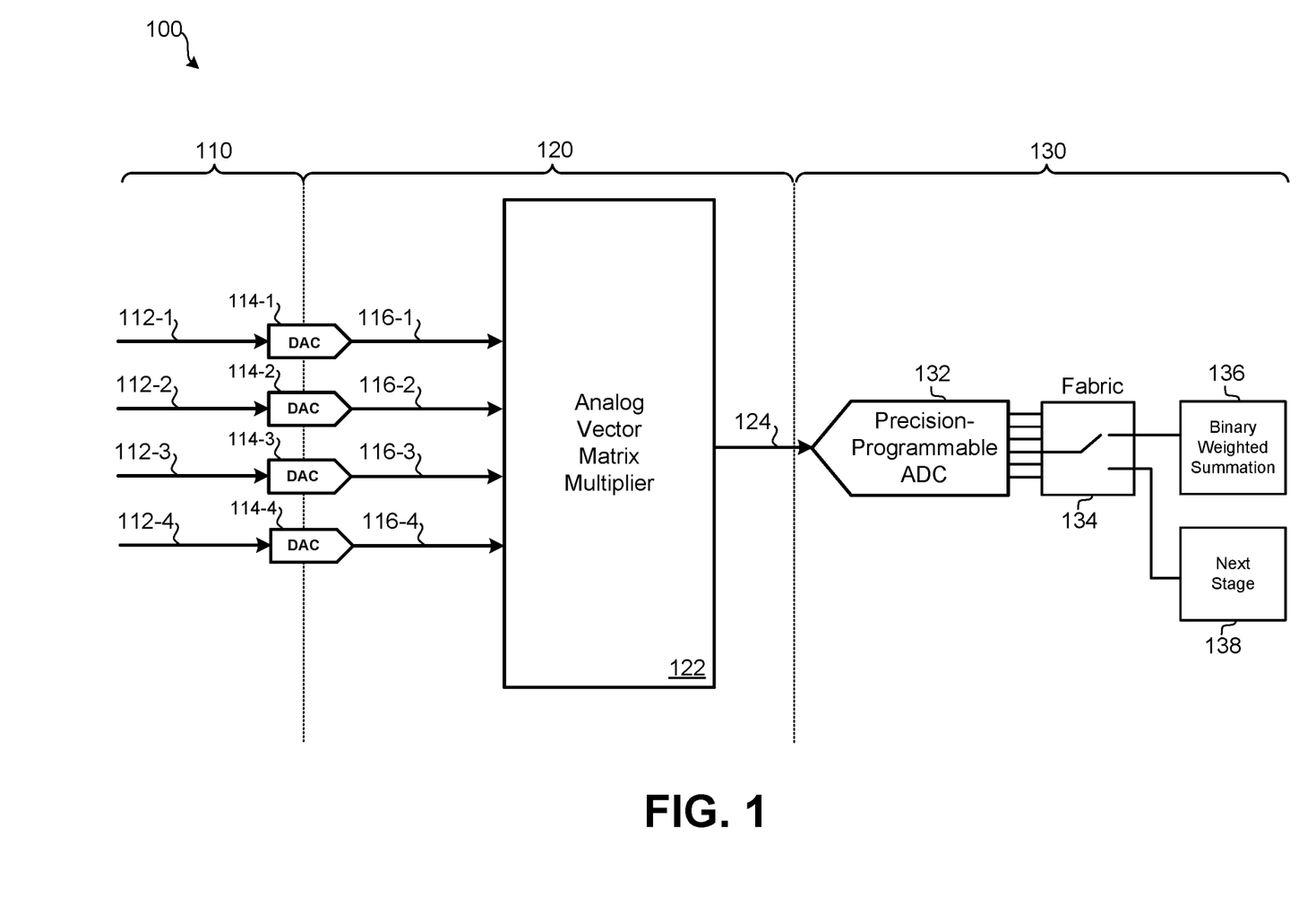
FIG. 1 illustrates an embodiment of a vector-matrix multiplier circuit in which vector multiplication is performed using analog components to bit-ordered binary values.

FIG. 1 illustrates an embodiment of a circuit 100 in which vector multiplication is performed using analog components on binary-encoded inputs. Circuit 100 can include: one-bit DACs 114; analog vector matrix multiplier 122 that performs binary-encoded vector multiplication operations; and an output circuit 130. Circuit 100 can be understood as divided into three sections. Section 110 receives binary-encoded digital signals (which represent an input vector) and converts the binary-encoded digital signals to binary-encoded analog signals. Section 120 receives binary-encoded analog signals and outputs binary-encoded products indicative of multiplication between the binary-encoded analog signals and a pre-defined matrix (e.g., a weighting matrix). The output circuit 130 may perform a bit-order weighted summation to sum the binary-encoded products and take into account the bit-order weighting of the binary-encoded signals. Therefore, the proper bit-orders of each bit of the binary-encoded input signals is maintained such that the summation can be determined properly. The output circuit 130 may use analog componentry to efficiently sum the product outputs of section 120. The output circuit 130 may also function in the digital domain.

Specifically, in section 110, multiple digital input signals 112 may be received in parallel. Digital input signals 112 represent binary-encoded values and each digital input signal of digital input signals 112 can represent a value of the vector $X_i$ of Equation 1. The binary bits of input signals 112 may be represented by voltage levels (e.g., high for one, low for zero), pulses (e.g., a pulse for one, no pulse for zero) or time (e.g., a pulse of a first duration for one, a pulse of a second duration for zero). As illustrated, four digital input signals (112-1, 112-2, 112-3, and 112-4) may be received in parallel. Each of these input signals may receive a separate value of the input vector. In other embodiments, fewer or greater numbers of digital input signals may be received than specifically illustrated in FIG. 1. Each of digital input signals 112 may be binary-encoded. Therefore, for each clock-cycle of the digital portion of the circuit, a bit for a particular bit-order may be received as digital input signals 112. For example, if four-bit binary values are being input via each digital input signal 112, four clock cycles may be used for each bit of the binary values to be received and converted to the analog domain in parallel. The digital input signals 112 may be binary-encoded such that each value's bit-order is from least significant bit (LSB) to most significant bit (MSB), from MSB to LSB, or in an arbitrary, pre-defined pattern.

Digital input signals 112 may be input to one-bit DACs 114. Again here, as illustrated, four one-bit DACs 114 (114-1, 114-2, 114-3, and 114-4) are present. In other embodiments, fewer or greater numbers of one-bit DACs 114 may be present. A single one-bit DAC may be present for each binary-encoded digital input signal 112. Each of the one-bit DACs 114 may output an analog signal indicative of the digital value received. Therefore, binary-encoded analog signals 116 (116-1, 116-2, 116-3, 116-4) can represent analog translations of the digital input signals 112.

Figure 2A:
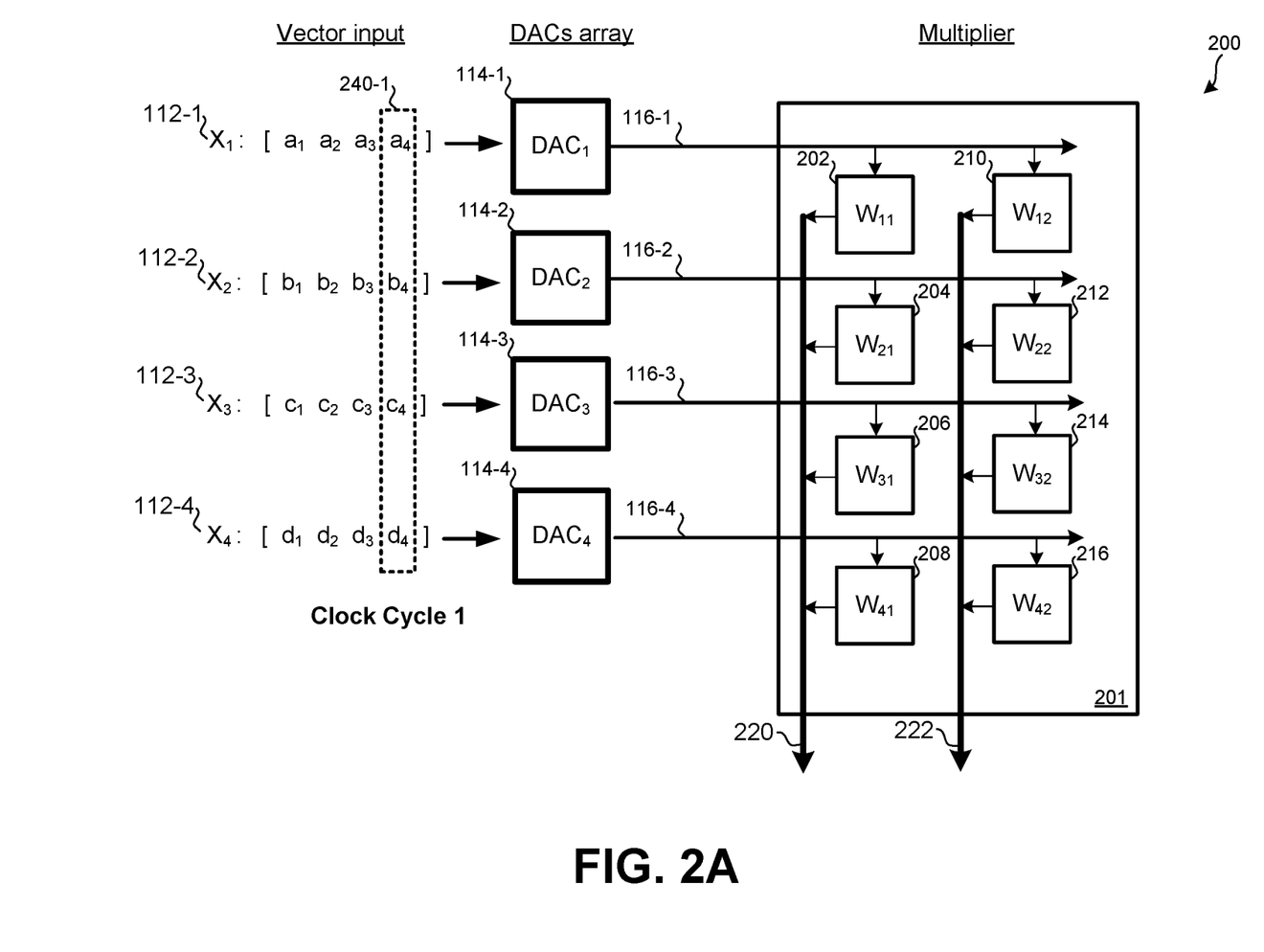
FIG. 2A illustrates an analog vector matrix multiplier that evaluates a single bit-order of an input vector that has been converted to analog during a first clock cycle, according to some embodiments.

In section 120, analog vector matrix multiplier 122 may receive binary-encoded analog signals 116. Analog vector matrix multiplier 122 may sequentially perform multiplication operations on each bit-order of the input values (e.g., a first clock cycle for the LSBs, a second clock cycle for the second LSBs, a third clock cycle for the second MSB, etc.). Therefore, a separate multiplication operation may be performed for each bit-order of the received binary-encoded analog signals 116. Further details regarding possible embodiments of analog vector matrix multiplier 122 are provided below in relation to FIG. 2.

The binary-encoded multiplication results signal 124 may be output to an output circuit 130. Previous implementations of the output circuit 130 may perform a binary-weighted summation operation on the analog outputs from the multiplier that correspond to the single bit-orders. For example, analog signals may be accumulated on capacitors in a switch capacitor array having capacitance values corresponding to bit-order. Each bit-order operation from the multiplier 122 may store the analog result on a capacitor. At the end of the multiplication cycle, charge may be redistributed between all of the capacitors, and the resulting voltage may then pass through an analog-to-digital converter (ADC) to generate a final result in the digital domain. Therefore, the binary-weighted accumulation operation took place prior to the ADC operation.

In contrast to these previous implementations, the output circuit 130 may perform an ADC operation on the analog partial outputs from each of the multiplication cycles. A programmable ADC 132 may be used to control the number of bits provided by the ADC function. This allows the precision of the ADC 132 to be programmable at runtime. While previous implementations may use static numbers of bits on the output such that the precision is not programmable, these embodiments allow a dynamic trade-off to be made between speed and precision.

First, the system may control the number of cycles performed by the multiplier 122 using the one-bit DACs 144. For example, if 8-bit inputs are provided to the DACs 114, a setting or input may be received that causes the DACs 114 to only consider the 4 most-significant-bits of the input. This allows the inputs to be truncated to an effective bit significance to limit the number of multiplication cycles performed by the multiplier 122. Alternatively, a system providing inputs to the DACs 114 may provide vectors of any length, and an input may be provided to the DACs 114 and/or the multiplier 122 that causes them to perform the specified number of cycles based on the input length of the provided input vectors.

Second, performing the ADC operation on the analog partial results output from the multiplier 122 provides further programmability and options for setting the precision of the system. For example, 8-bit inputs may be provided to the DACs 114, and eight corresponding multiplication cycles may be performed by the multiplier 122. However, the ADC 132 may be programmed to only output 2-bit outputs representing each partial result. This allows the number of bits provided on the output to also be programmable at runtime. No hardware needs to be changed because a setting or input may be provided to the ADC 132 at runtime to control the number of bits provided at the output of the ADC 132 for each partial result.

Switching fabric 134 (e.g., a plurality of multiplexers coupled to each output of the ADC 132) may route the binary partial results from the ADC 132 to a number of different locations. First, the binary partial results may be routed to a binary-weighted summation circuit 136. Instead of using analog capacitors or other analog circuitry, the binary-weighted summation can be performed entirely in the binary domain. For example, the binary-weighted summation circuit 136 may be implemented using a binary shifter and a binary adder in the binary domain. When the first binary partial result is received, that binary partial result may be added to an empty accumulation register. When subsequent binary partial results are received, they may be shifted to the right a number corresponding to their bit order. For example, the second binary partial result could be shifted one bit to the right and then added to the accumulation register. A new binary partial result may be received at each clock cycle after the binary partial result is received, and the final result may be stored in the accumulation register of the binary-weighted summation circuit 136 N clock cycles after the first binary partial result is received for an N-bit input.

The switching fabric 134 may also route the binary partial results to subsequent MCA stages in a multi-MAC pipeline or crossbar array. A subsequent bit-order MAC may receive and provide the partial results at corresponding one-bit DACs 114 in the subsequent stage. This allows a subsequent bit-order MAC to immediately begin executing multiplication cycles. This may also allow subsequent-order MACs to generate results as soon one clock cycle after a result is generated in a previous bit-order MAC in a processing pipeline. For example, if the first bit-order MAC generates a result in N clock cycles, a subsequent bit-order MAC may generate a result based on this previous result at the N+1 clock cycle. The Mth stage in an N-bit pipeline may generate a final result in approximately N+M clocks cycles instead of N×M clock cycles.

FIG. 2A illustrates an analog vector matrix multiplier 201 that evaluates a single bit-order of an input vector that has been converted to analog during a first clock cycle, according to some embodiments. Analog vector matrix multiplier 201 may represent an embodiment of analog vector matrix multiplier 122 of FIG. 1. However, it should be understood that embodiment 200 is only an example. In FIG. 2, the binary vector input $X_i$ is to be multiplied with $W_{ij}$. Analog vector matrix multiplier 201 may include multiple weighting elements (202, 204, 206, 208, 210, 212, 214, and 216). Each weighting element may receive a binary-encoded analog signal of binary-encoded analog signals 116 from a one-bit DAC. In this example, the weighting element may output a current based on the voltage of its received binary-encoded analog signal and a weighting value of the particular weighting element. For instance, each weighting element may be implemented using various conductances. By varying the conductances of the weighting components, the amount of current output depending on the input voltage can be varied. For instance, if the voltage is 1 V, and the conductance of a weighting block is 8 µS, an output of 8 µA may be obtained. This value may further be weighted based on the bit-order of the value. Therefore, for the least significant bit, the multiplier would be 1, for the second LSB, the multiplier would be 2, and so on. In some embodiments, the weightings used by each weighting element may be predetermined and fixed at manufacture. In other embodiments, the weighting of each weighting element may be configurable after manufacture and reconfigurable during use of embodiment 200.

The output of each weighting element (202, 204, 206, 208, 210, 212, 214, and 216) can be an electrical characteristic, such as current. The currents output from the weighting elements connected to a same current output may be summed together. Therefore, current output 220 may include the sums of the current output by weighting elements 202, 204, 206, and 208; and current output 222 may include the sums of the current output by weighting elements 210, 212, 214, and 216.

A single bit of each value of the input vector is evaluated at a time (and bit-order is not taken into account by analog vector matrix multiplier 201). For example, for an input vector having four four-bit values, the MSB of each value may be evaluated first, followed by the second MSB of each value, followed by the second LSB, and finally followed by the LSB of each value (thus corresponding to four clock cycles of binary-encoded data output by the one-bit DACs). In other embodiments, evaluation may proceed from LSB to MSB or in any other predefined, arbitrary order. As detailed later in this document, the output of analog vector matrix multiplier 201 may be weighted by the summation circuitry to take into account the bit-order of the bits to which the multiplication operation is being performed by the vector matrix multiplier.

The number of columns of weighting elements is arbitrary and can be based on the weighting matrix with which the input vector is being multiplied. Therefore, while two columns are present in embodiment 200, fewer or a greater number of columns may be present in other elements. The number of rows of weighting elements may correspond to the number of values present in the input vector. For example, equation 2 can represent the current output by analog vector matrix multiplier 201:

$$I_{out_i} = \sum_{j=1}^{4} v_j * w_{ji}, i = 1 \ldots n \qquad \text{Eq. 2}$$

Continuing with the example, current outputs (e.g., current outputs 220, 222) may be connected together to create a binary-encoded multiplication result signal 124. The output circuit 130 may properly weight, stores, then sum each bit-order to obtain a correct final summation. Alternatively, a binary-domain implementation of the output circuit 130 is described in detail below.

Figure 2B:
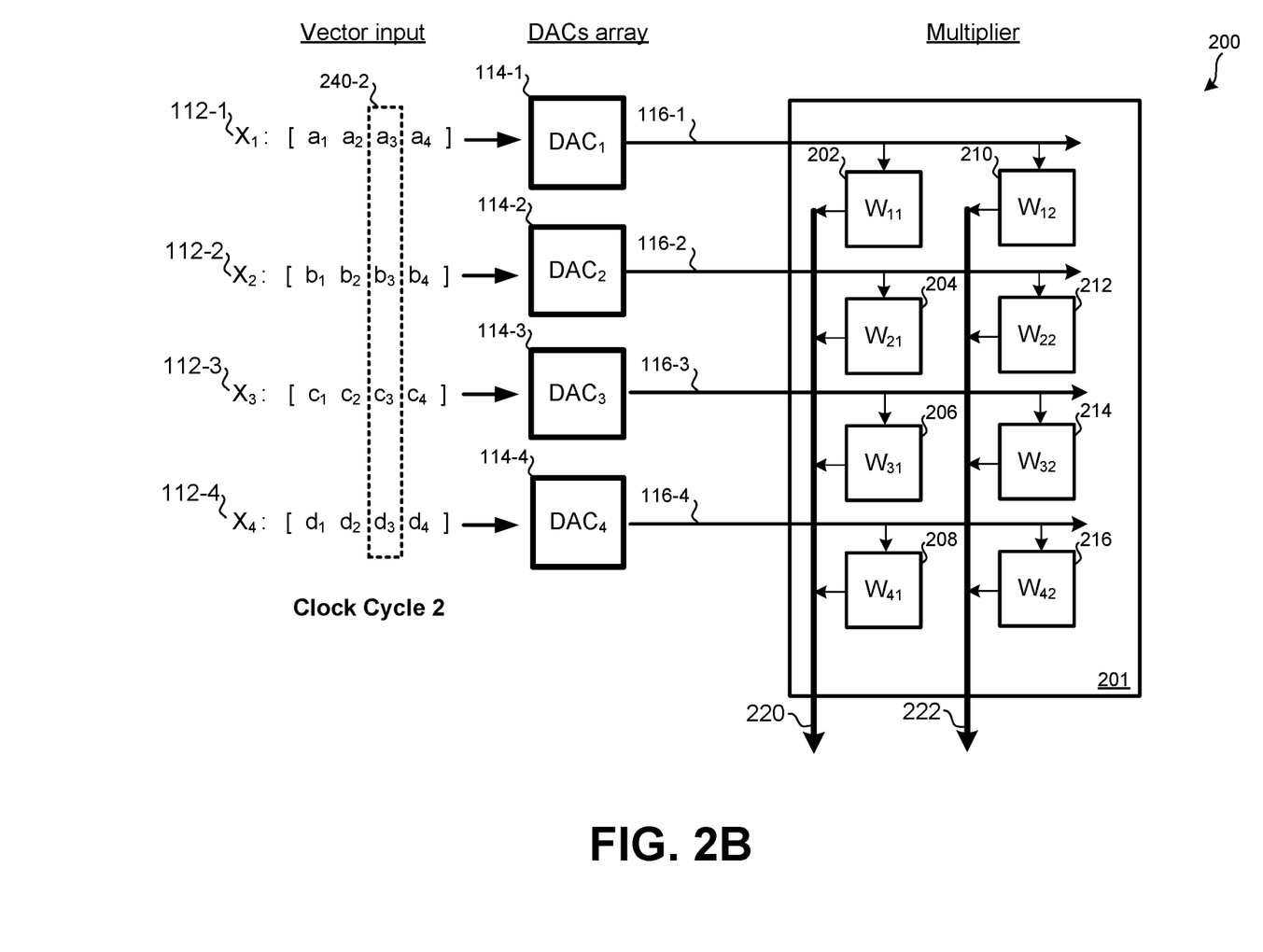
FIG. 2B illustrates the analog vector matrix multiplier during a second clock cycle, according to some embodiments.

FIG. 2B illustrates the analog vector matrix multiplier 201 during a second clock cycle, according to some embodiments. Instead of processing the $a_4$, $b_4$, $c_4$, $d_4$ bits from each digital input signals 112, the DACs 114 and multiplier 201 may process the $a_3$, $b_3$, $c_3$, $d_3$ bits from each of the digital input signals 112. Note that these inputs may be processed without requiring other bits in the input vectors. Thus, to begin processing the digital input signals 112 during a clock cycle, the DAC is 114 only need one bit from each of the digital input signals 112 to be available during that clock cycle. This allows bits to arrive serially at the DACs 114 as they are produced as partial outputs from previous multiplication operations. Described above, an ADC operation may be performed on each partial result, and these bits from the ADC operation may be provided to a subsequent set of DACs 114 in a subsequent bit-order MAC.

Figure 3:
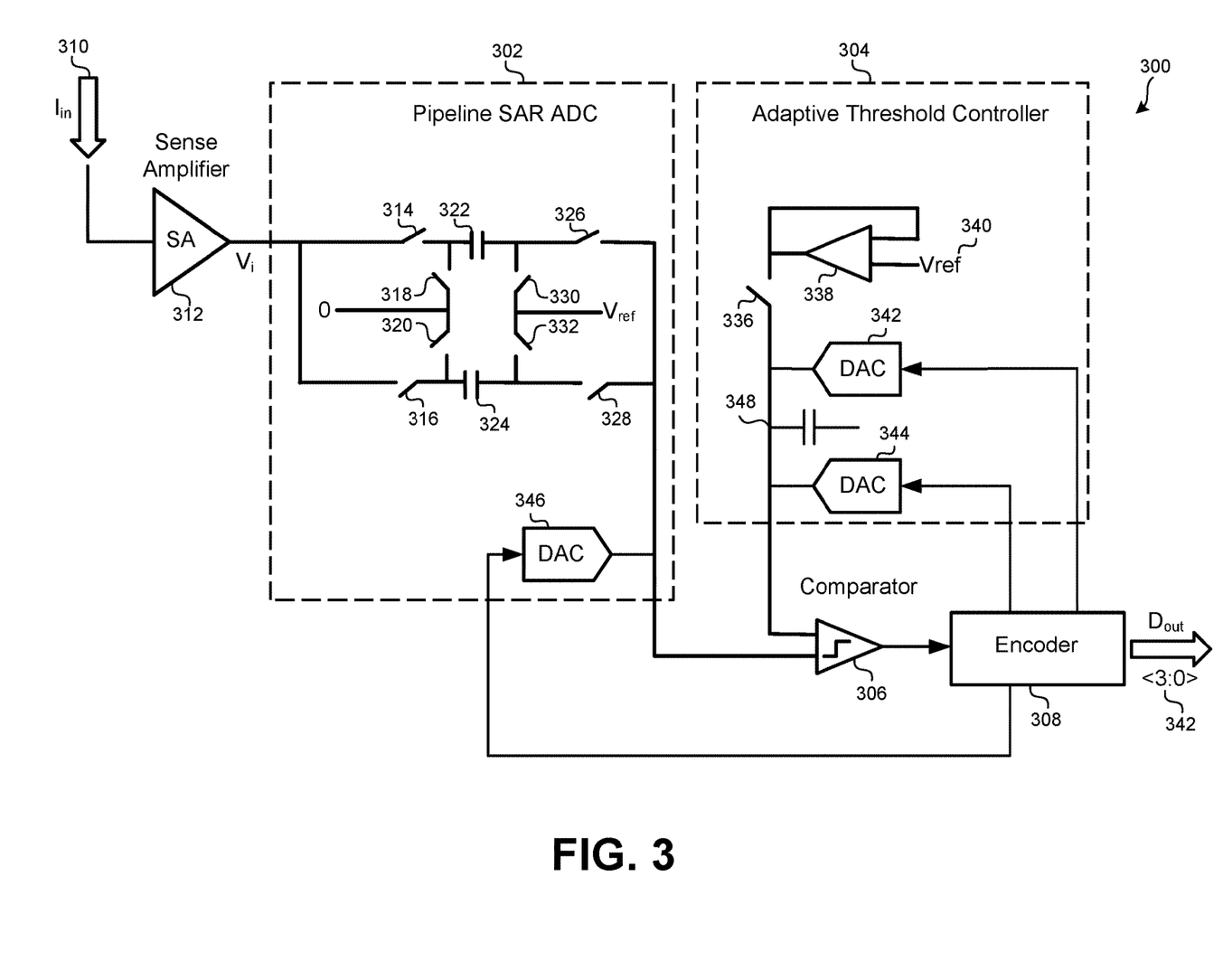
FIG. 3 illustrates an example of a multi-precision and self-calibrated ADC that generates binary partial output vectors, according to some embodiments.

FIG. 3 illustrates an example of a multi-precision and self-calibrated ADC 300 that generates binary partial output vectors, according to some embodiments. An input current 310 representing the analog output of the multiplier may be received at a sense amplifier 312. The sense amplifier may convert the analog current into a voltage that is fed into a pipelined capacitor network 302 for an ADC. The capacitor network 302 may include a plurality of capacitors and a plurality of switches such that a current result can be stored on a first capacitor while a previous result is read from a second capacitor by the ADC operation.

For example, when a first input is received from the multiplier, switch 314 and switch 330 may be closed such that a difference between the output voltage of the sense amplifier 312 and the $V_{ref}$ voltage reference may be stored on capacitor 322. Switch 326 and switch 318 may be open to isolate capacitor 322 from the rest of the capacitor network 302. Similarly, switch 316 and switch 332 may be open to isolate capacitor 322 from capacitor 324. Switch 328 and switch 320 may be closed such that a value on capacitor 324 may be provided to an input of a comparator 306 for an ADC operation. When a second input is received from the multiplier, the capacitor network 302 may open switch 314 and switch 330 while closing switch 316 and switch 332. This allows the second input to be stored on capacitor 324. During this second cycle, switch 326 and switch 318 may be closed such that the voltage capacitor 322 may be provided as an input to the comparator 306. These switching operations may be alternately repeated back and forth such that one of the capacitors 322, 324 receives the input from the sense amplifier 312, while the other one of the capacitors 322, 324 provides the input from a previous cycle to the comparator 306. This parallel pipeline of operations allows an ADC operation to be completed every clock cycle after the first clock cycle. In comparison, serial ADC operations without this pipelined approach use two clock cycles for every conversion operation: one clock cycle to store the input from the multiplier, and a second clock cycle to convert the stored input to a digital value. This pipelined embodiment effectively cuts the number of cycles required for an operation in half.

The ADC operation may be performed in part by a comparator 306 performing a sequence of comparisons. This comparator may receive a value provided by alternating stages of the pipeline from the capacitor network 302 at one input. At the other input, the comparator 306 may receive a voltage from an adaptive threshold controller 304. This adaptive threshold controller 304 may include a programmable voltage reference 340. This voltage reference 340 may be set dynamically during operation to a desired value. For example, a controller, a microcontroller, a computing system, a state machine, programmable logic, and/or a digital circuit may provide a digital output that is converted into an analog voltage using a DAC. Other embodiments may use adjustable resistors in a voltage divider to provide the reference voltage 340. Optionally, this example provides the voltage reference 340 to a unity gain buffer 338, which may be implemented by, for example, an op app arranged as a voltage follower where the output is provided to the inverting input as negative feedback, and the voltage reference 340 is provided to the non-inverting input. A switch 336 may allow the voltage reference to be provided to the second input of the comparator 306.

This ADC operation may be carried out by performing successive comparisons by the comparator 306 for each value provided from the capacitor network 302. For example, an initial comparison may be made to generate a first bit in a partial output vector. The initial value of the voltage reference 340 may determine whether the input value from the capacitor network 302 represents a binary 0 or a binary 1. After this value is recorded as the MSB of the partial output vector, the encoder 308 may generate analog feedback signals that are routed into one or more DACs 342, 344, 346. These digital feedback values may be converted into analog voltages that are injected into one or both of the inputs to the comparator. For example, the feedback provided to DAC 346 may be dependent on the previous input received and the dynamic range for the ADC operation (i.e., the number of bits in each of the partial output vectors). The feedback provided to DAC 342 may be threshold dependent in the time domain, and may be adjusted with each successive bit that is generated in the partial output vector. The feedback provided to DAC 344 may be input dependent in the time domain, and may be adjusted based on a previous value generated in the partial output vector. Each output of the comparator 306 may be provided to a finite state machine in the encoder 308, and the finite state machine may generate feedback outputs for each of the DACs 342, 344, 346. Thus, during a single cycle, the comparator 306 may be repeatedly used to generate a partial output vector of bits rather than a single bit output.

Each partial result from the multiplier provided as an analog input current 310 may generate a partial output vector of any length. In other words, the dynamic range of the ADC operation may be set independently from the number of bits in the input vectors. For example, a 8-bit input vector may be provided to the multiplier, resulting in up to approximately 9 clock cycles to generate a full result. However, each of the partial output vectors generated by the ADC operation may be set at 2 bits, 3 bits, 4 bits, and/or any other desired value. The number of bits in the partial output vectors may be set dynamically for each individual MAC operation. For example, input vectors provided to the MAC may include inputs that set the number of bits to be processed by the one-bit DACs on the input, as well as the number of bits to be used in the partial output vectors and the final output vector. This allows the overall process time for the MAC operation to be set as a trade-off with the precision of the MAC operation. This trade-off can be made for each operation individually without changing the hardware. Instead, the settings can be provided in software to the programmable ADC operation and/or to the multiplication operation.

Another benefit provided by these embodiments is the adjustable calibration and precision provided by the adaptive threshold controller 304. The voltage reference 340 can be adjusted to compensate for temperature variations, drift over time, process variations, and/or other factors that may cause an undesired differential between the inputs at the comparator 306. Some embodiments may also include capacitors, such as capacitor 348, that can be used to calibrate the values provided to the comparator. For example, test values may be provided to the MAC, and the resulting outputs may be compared to expected results for that operation. The difference between these expected results may be used to adjust the voltage reference 340. In some cases the state machine in the encoder 308 may also adjust the feedback values provided to the DACs 342, 344, 346.

Figure 4A:
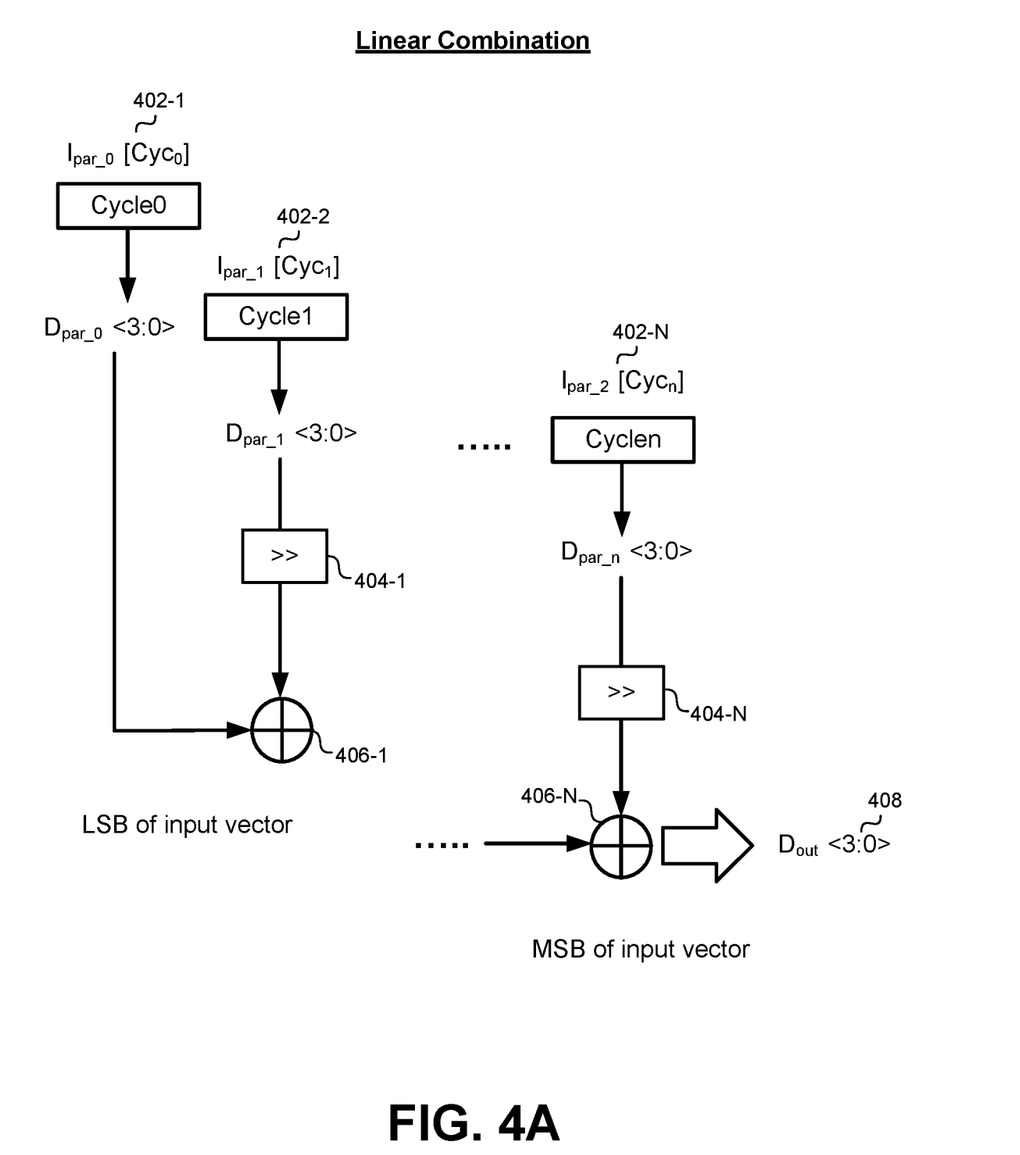
FIG. 4A illustrates a diagram of a binary-weighted summation circuit, according to some embodiments.

As described above, the partial output vectors generated by the ADC operation may be routed through switching fabric to a number of different locations. For example, the switching fabric may route the partial output vectors to a subsequent stage in a multi-MAC pipeline. Additionally or alternatively, the switching fabric may route the partial output vectors to a binary-weighted summation circuit. FIG. 4A illustrates a diagram of a binary-weighted summation circuit, according to some embodiments. Because the partial output vectors have already been converted to the binary domain by the ADC operation described above, these can be accumulated using binary shift operations 404 and/or binary addition operations 406. For example, a partial output vector 402-1 corresponding to an MSB may be received and stored in an accumulation register. Next, a partial output vector 402-2 corresponding to a next-MSB may be received, shifted according to its bit-order, and added to the previous value in the accumulation register. This procedure may continue until each of the bits provided at the input of the MAC have been processed for a MAC operation. Again, the number of bits in each of the partial output vectors may be set for each individual MAC operation, and may be limited only by the dynamic range of the ADC operation. After N+1 cycles, a final output 408 may be provided. In this example, 8-bit inputs have generated a 4-bit output.

Figure 4B:
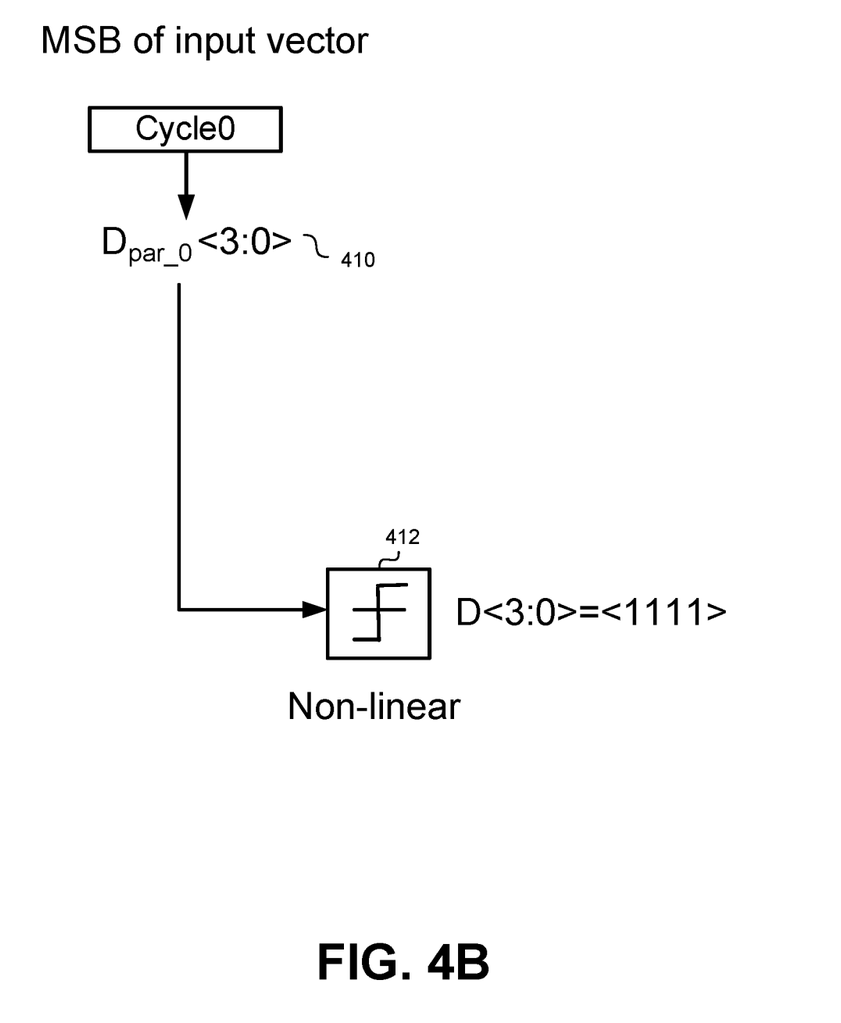
FIG. 4B illustrates a circuit for detecting when a MAC operation may be terminated early using a nonlinear threshold, according to some embodiments.

In some embodiments, the MAC operation may be terminated early based on the contents of the partial output vectors and/or the intermediate results of the binary-weighted summation operation. FIG. 4B illustrates a circuit for detecting when a MAC operation may be terminated early using a nonlinear threshold, according to some embodiments. For example, a nonlinear function 412 may determine when a maximum output value has been reached. If the partial output vector corresponding to the MSB of the input vectors is already at a maximum value (e.g., 1111), then the nonlinear function 412 may detect this occurrence. If the maximum value is already in the accumulation register, no additional accumulation needs to take place. In response, the MAC operation for the current inputs may be terminated early, and the partial output vector may be provided as the final output. This comparison may be made for individual partial output vectors and/or for the value in the accumulation register.

Figure 5:
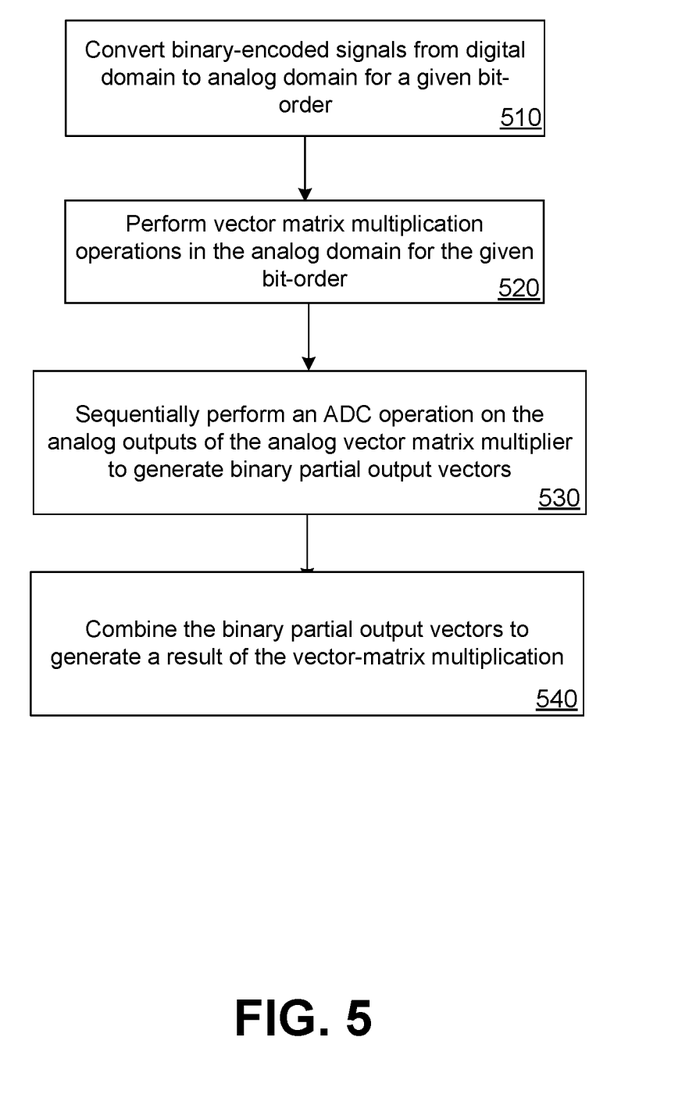
FIG. 5 illustrates a flowchart of a method for performing a vector-matrix multiplication operation, according to some embodiments.

FIG. 5 illustrates a flowchart 500 of a method for performing a vector-matrix multiplication operation, according to some embodiments. Flowchart 500 may be performed using the circuits of FIGS. 1-4 or with alternate versions of such circuits. That is, it should be understood that the specific examples of circuits, such as those in FIGS. 2-4, are examples of how the circuit of FIG. 1 and the method of FIG. 5 may be implemented.

The method may include converting a digital input vector comprising a plurality of binary-encoded values into a plurality of analog signals using a plurality of one-bit DACs (510). To perform this function, multiple one-bit DACs may be used in parallel. Therefore, each DAC may convert a digital signal to an analog signal for a given bit-order in parallel. Each DAC may receive a binary-encoded digital signal that is indicative of a particular bit-order for an input vector. Each vector may have N bits. Therefore, for the one-bit DACs to convert the binary-encoded digital signals to analog signals may take N clock cycles. For example, if the binary-encoded digital signal is "10011," it may take five clock cycles for this binary-encoded value (which represents a value of 19 assuming the right-most digit is the LSB) to be output by a one-bit DAC. The analog voltage output by each one-bit DAC may be dependent on a power voltage provided to each one-bit DAC.

The method may also include sequentially performing vector-matrix multiplication operations using a weighting matrix for the plurality of analog signals to generate analog outputs of an analog vector matrix multiplier (520). This operation may be performed for the particular bit-order of the input vectors received from the one-bit DACs. That is, this operation may first be performed for each LSB of the values of the input vector (then, during a next iteration of block 420, the second LSB may be evaluated). Typically, the first bit evaluated would be either the MSB or LSB of the values of the input vector. Vector matrix multiplication may be performed by a circuit similar to the circuit illustrated FIG. 2. It should be understood that other embodiments of analog multiplication circuits are possible. The vector matrix multiplication multiplier may include weighting components that each cause a weighted amount of current indicative of the product of the analog input value and the weighting. Such currents, or some other electrical characteristic, may be output to summation circuitry.

The method may additionally include sequentially performing an ADC operation on the analog outputs of the analog vector matrix multiplier to generate binary partial output vectors (530). In some embodiments, the ADC operation may include using a parallel pipeline of capacitors and switches as depicted in FIG. 3. The parallel pipeline may store a first voltage representing a first analog output on a first capacitor during a current clock cycle, and may read a second voltage representing a second analog output from a second capacitor received during a previous clock cycle. The ADC operation may include repeatedly generating comparisons using a comparator, where a finite state machine generates digital feedback for a plurality of DACs that inject the feedback into the comparator inputs between sequential comparisons. The sequential comparisons may generate the individual bits in the binary partial output vector as described above.

The method may further include combining the binary partial output vectors to generate a result of the vector-matrix multiplication (540). Because the binary partial output vectors are already in the binary domain, combining these vectors in a binary-weighted summation process may use binary shift and binary addition operations as described above in FIG. 4A-4B. In some embodiments, the binary partial output vectors may also be provided to a subsequent MAC circuit in a subsequent stage of a MAC pipeline.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered

What is claimed is:

1. A method for performing vector-matrix multiplication, the method comprising:
    converting a digital input vector comprising a plurality of binary-encoded values into a plurality of analog signals using a plurality of one-bit digital to analog converters (DACs);
    sequentially performing, using an analog vector matrix multiplier and based on bit-order, vector-matrix multiplication operations using a weighting matrix for the plurality of analog signals to generate analog outputs of the analog vector matrix multiplier;
    sequentially performing an analog-to-digital (ADC) operation on the analog outputs of the analog vector matrix multiplier to generate binary partial output vectors; and
    combining the binary partial output vectors to generate a result of the vector-matrix multiplication.

2. The method of claim 1, wherein a number of clock cycles to sequentially perform the vector-matrix multiplication operations using the weighting matrix is equal to a number of bit-orders of the binary-encoded values of the input vector.

3. The method of claim 1, wherein sequentially performing the ADC operation comprises:
    storing a first voltage representing a first analog output in the analog outputs on a first capacitor during a current clock cycle; and
    reading a second voltage representing a second analog output in the analog outputs on a second capacitor during the current clock cycle, wherein the second voltage was stored on the second capacitor during a previous clock cycle.

4. The method of claim 1, wherein generating the binary partial output vectors comprises comparing a voltage representing an analog output in the analog outputs to a voltage reference.

5. The method of claim 4, wherein generating the binary partial output vectors further comprises generating digital feedback based on a result of comparing the voltage to the voltage reference.

6. The method of claim 5, wherein generating the binary partial output vectors further comprises converting the digital feedback into analog feedback and injecting the analog feedback into the voltage and the voltage reference to repeatedly generate bits for a binary partial output vector in the binary partial output vectors.

7. The method of claim 4, further comprising adjusting the voltage reference based on a difference between results of the vector-matrix multiplication and an expected result.

8. A vector-matrix multiplier circuit, comprising:
    a plurality of digital inputs, wherein each digital input receives a binary-encoded input value of an input vector;
    a plurality of one-bit digital to analog converters (DACs), wherein:
        each one-bit DAC is connected with a corresponding digital input of the plurality of digital inputs; and
        each one-bit DAC outputs a binary-encoded analog signal for the corresponding digital input;
    an analog vector matrix multiplier circuit that performs binary-encoded vector multiplication operations on a single bit-order at a time, wherein the analog vector matrix multiplier circuit receives the binary-encoded analog signal from each one-bit DAC of the plurality of one-bit DACs and generate analog outputs corresponding to the single bit-orders;
    an analog-to-digital converter (ADC) that generates binary partial output vectors from the analog outputs; and
    a binary-weighted summation circuit that combines the binary partial output vectors to generate a result for the vector-matrix multiplier circuit.

9. The vector-matrix multiplication circuit of claim 8, wherein the analog vector matrix multiplier circuit outputs a plurality of currents indicative of vector multiplication outputs.

10. The vector-matrix multiplication circuit of claim 8, wherein the analog vector matrix multiplier circuit comprises a plurality of weighting components that apply a pre-defined weighting to output from the analog vector matrix multiplier circuit.

11. The vector-matrix multiplication circuit of claim 8, wherein the ADC comprises a capacitor network comprising a first pipeline and a second pipeline of capacitors and switches.

12. The vector-matrix multiplication circuit of claim 8, wherein the ADC comprises a comparator that generates a plurality of comparisons during one of the binary-encoded vector multiplication operations by generating a sequence of comparisons.

13. The vector-matrix multiplication circuit of claim 12, further comprising a finite state machine that generates feedback that is injected into inputs of the comparator between comparisons in the sequence of comparisons.

14. The vector-matrix multiplication circuit of claim 8, wherein the binary-weighted summation circuit comprises a binary shift and a binary addition operation.

15. The vector-matrix multiplication circuit of claim 8, wherein the binary-weighted summation circuit comprises a circuit that detects when a maximum output value has been reached and terminates the binary-encoded vector multiplication operations.

16. An apparatus for performing vector-matrix multiplication, the apparatus comprising:
    a plurality of one-bit digital to analog converters (DACs) that convert an input vector comprising a plurality of binary-encoded values into a plurality of analog signals;

means for sequentially performing, using an analog vector matrix multiplier and based on bit-order, vector-matrix multiplication operations using a weighting matrix for the plurality of analog signals to generate analog outputs of the analog vector matrix multiplier;

means for sequentially performing an analog-to-digital (ADC) operation on the analog outputs of the analog vector matrix multiplier to generate binary partial output vectors; and means for combining the binary partial output vectors to generate a result of the vector-matrix multiplication.

17. The apparatus for performing the vector-matrix multiplication of claim 16, wherein a number of clock cycles to sequentially perform the vector-matrix multiplication operations for each-bit-order is equal to a number of bit-orders of the binary-encoded values of the input vector.

18. The apparatus for performing the vector-matrix multiplication of claim 16, further comprising a DAC that injects feedback that is input dependent and range dependent into a comparator that generates the binary partial output vectors.

19. The apparatus for performing the vector-matrix multiplication of claim 16, further comprising a DAC that injects feedback that is input dependent in a time domain into a comparator that generates the binary partial output vectors.

20. The apparatus for performing the vector-matrix multiplication of claim 16, further comprising a DAC that injects feedback that is threshold dependent in a time domain into a comparator that generates the binary partial output vectors.

* * * * *